(12) United States Patent
Piloni

(10) Patent No.: US 6,198,912 B1
(45) Date of Patent: Mar. 6, 2001

(54) FREQUENCY CONVERTER FOR THE APPLICATION ON MILLIMETRIC RADIO WAVES

(75) Inventor: Marco Piloni, Vimodrone (IT)

(73) Assignee: Siemens Information and Communication Networks, S.p.A., Milan (IT)

(*) Notice: Subject to any disclaimer, the term of this patent is extended or adjusted under 35 U.S.C. 154(b) by 0 days.

(21) Appl. No.: 09/194,752

(22) PCT Filed: Nov. 6, 1997

(86) PCT No.: PCT/EP97/03067

§ 371 Date: Feb. 3, 1999

§ 102(e) Date: Feb. 3, 1999

(87) PCT Pub. No.: WO97/49172

PCT Pub. Date: Dec. 24, 1997

(30) Foreign Application Priority Data

Jun. 18, 1996 (IT) ............................. MI96A01226

(51) Int. Cl.[7] ................ H04B 1/26; H04B 1/10; H01P 1/00; H01P 5/00

(52) U.S. Cl. ............ 455/325; 455/302; 455/327; 455/328; 333/250

(58) Field of Search ........................ 455/302–303, 455/323, 325–333; 333/246, 254, 248, 250, 247, 218

(56) References Cited

U.S. PATENT DOCUMENTS

| 3,584,306 | * | 6/1971 | Spacek | 455/327 |
| 3,638,126 | * | 1/1972 | Spacek | 455/328 |
| 3,882,396 | * | 5/1975 | Schneider | 455/325 |
| 4,229,828 | * | 10/1980 | Braird et al. | 455/326 |
| 4,276,655 | * | 6/1981 | Kraemer et al. | 455/327 |
| 4,365,195 | * | 12/1982 | Stegens | 333/246 |
| 4,412,354 | * | 10/1983 | Hu | 455/327 |
| 4,480,336 | * | 10/1984 | Wong et al. | 455/328 |
| 4,789,840 | * | 12/1988 | Albin | 333/250 |
| 4,955,079 |   | 9/1990 | Connerney et al. | 455/325 |
| 5,953,644 | * | 9/1999 | Kool et al. | 455/328 |

FOREIGN PATENT DOCUMENTS

| A1 36-32002 | 4/1988 | (DE) . |
| A1 36-37827 | 5/1988 | (DE) . |
| A1 0-186295 | 7/1986 | (EP) . |

OTHER PUBLICATIONS

Schneider and Snell, "Harmonically Pumped Stripline Down–Converter", IEEE Transactions on Microwave Theory and Techniques, vol. mtt–23, No. 3, Mar. 1975, pp. 271–275.

* cited by examiner

*Primary Examiner*—Nay Maung
*Assistant Examiner*—Raymond Persino

(57) ABSTRACT

The following description regards a frequency converter (1) for applications on millimetric radio waves. The circuit structure comprises a diplexer filter realized in thin film on an alumina layer connected to a balun set up by a quartz plate on which two mixing diodes in GaAs have been mounted, placed in the center of a rectangular cavity (2) closed on one side by a short circuit plate and on the opposite side communicating with a rectangular waveguide (4) transporting a radio frequency signal (RF). On the upper side of the plate three parallel metallic bands have been put in the sense of the width of the cavity, between the bands the diodes are connected in series. The most external bands are welded to the walls of the cavity (2), the central one on the other hand is connected to the point common to both sections of the diplexing filter by means of a metallic strap in the air welded to a microstrip. The ports of the local oscillator signals (LO) and an intermediate frequency (IF) are set up by two connected coaxial connectors (7, 8) by means of glassbead (5, 6) to respective microstrips of the diplexer filter.

12 Claims, 2 Drawing Sheets

FREQUENCY CONVERTER FOR THE APPLICATION ON MILLIMETRIC RADIO WAVES

This application is the national phase under 35 U.S.C. §371 of prior PCT International Application No. PCT/EP97/03067 which has an International filing date of Nov. 6, 1997 which designated the United States of America, the entire contents of which are hereby incorporated by reference.

FIELD OF THE INVENTION

The present invention relates to the sector of the transmitting and receiving of microwave signals, and more precisely to a frequency converter for applications to millimetric radio waves.

In the range of the millimetric radio waves regarding frequencies starting from 30 GHz it is possible to realize very compact and miniaturized frequency converters, thanks also to the reduced dimensions of the cross sections of the rectangular waveguides interconnected to these.

This type of converters are generally realized in thin films, and the dielectric layers are put into metallic packages. The frequency conversion is carried out by diodes. There is a problem regarding the forwarding of the radiofrequency signal from the waveguide towards the diodes and vice versa, and the problem of carrying out a transition between the metallic waveguide and the microstrip circuit connected to the diodes.

BACKGROUND ART

A known solution to this problem consists in the introduction into the guide of an end of a small cylindric conductor the other end of which is welded to the microstrip. The above-mentioned conductor operates as an antenna in the guide and transfers the there existing radiofrequency signal to the microstrip, or vice versa.

SUMMARY OF THE INVENTION

The present invention concerns a frequency converter realized in thin film with a simple structure and it makes it possible to connect the waveguide of the radiofrequency signal directly to a cavity containing the diodes avoiding the use of additional transition means put between the guide, the diodes and the part in microstrip of the circuit. In the first analysis it is possible to say that the mixer diodes also carry out the transition from the guide to the microstrip or the opposite transition. In order to allow such aims the object of the present invention is a microwave frequency converter as described in the main claim.

BRIEF DESCRIPTION OF THE DRAWINGS

The feature of the present invention which are believed to be novel are set fort with particularity in the appended claims.

The invention, together with further objects and advantages thereof, may be understood with reference to the following description taken in conjunction with the accompanying drawings, and the several figures of which like referenced numerals identify like elements, and in which:

With reference to FIG. 1 it is possible to see a microwave frequency converter set up by a metallic body 1 where three interconnected cavities have been realized. A first cavity 2 with a rectangular section extending along an axis B—B of horizontal symmetry of the body 1. Cavity 2 communicates with narrower rectangular cavity 3 allocated along the same axis B—B. The last one at its turn communicates with a third rectangular cavity 4 put perpendicularly to the axis B—B extending more or less up to the edges of body 1. Cavity 2 passes through the entire thickness of the metallic body 1, while the cavities 2 and 3 end at approximately half of the thickness. The shorter walls of cavity 4 are provided with holes in the centre to receive two cylindric feedthroughs 5 and 6, called hereafter glass-beads, which are at their turn connected with two coaxial connectors 7 and 8 arranged along the central line of the cavity 4. The connectors 5 and 7 and the connectors 6 and 8 are rigidly connected to two opposite walls of cavity 4 by means of the respective metallic supports 9 and 10 screwed to the flanks of the metallic container 1. The cavities 2, 3 and 4 include the thin film circuit part of the converter which will be illustrated when examining FIG. 3. A local oscillator signal LO reaches connector 7 and from connector 8 an intermediate frequency signal IF comes out.

Referring to FIG. 2 where the same elements of FIG. 1 are indicated by the same symbols, it is possible to see the metallic body 1 and the cavities 2, 3 and 4 sectioned along a plane cutting perpendicularly body 1 along the centre line B—B. Inside cavity 2 a groove 11 can be seen which starts from the lower side of the metallic body 1 and extends up to approximately half of the thickness, an analogous groove exists on the opposite part of the section plane. The grooves 11 are necessary for the introduction in the cavity and the anchorage of a plate supporting two mixer diodes, better shown in FIG. 3. The lower part of cavity 2 is closed by a metallic plate 12 fixed to body 1 by means of screws. In the upper part of cavity 2 a reception radio frequency signal RF entering cavity 2 is indicated.

Figure 1:
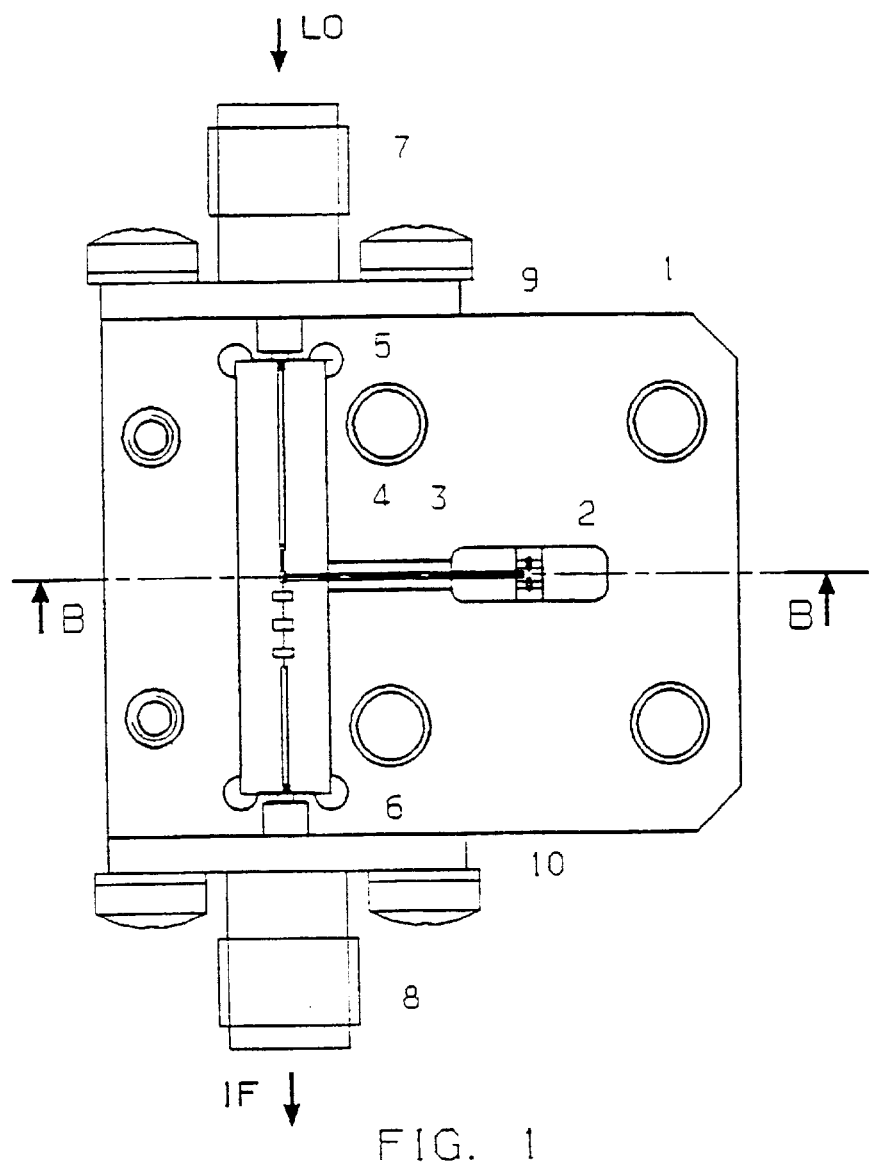
FIG. 1 shows a perspective view of the microwave frequency converter according to the present invention.
Figure 2:
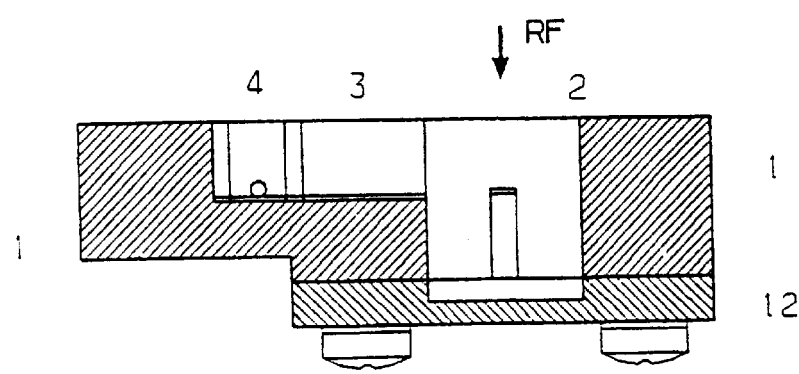
FIG. 2 illustrates the section view according to the plane B—B of FIG. 1.

For simplicity reasons the FIGS. 1 and 2 do not show a metallic flange closing the cavities 3 and 4 on the upper part of body 1 with tightening screws and supporting a rectangular waveguide (even if not visible in the figure) communicating with cavity 2, where the radio frequency signal RF converges.

Figure 3:
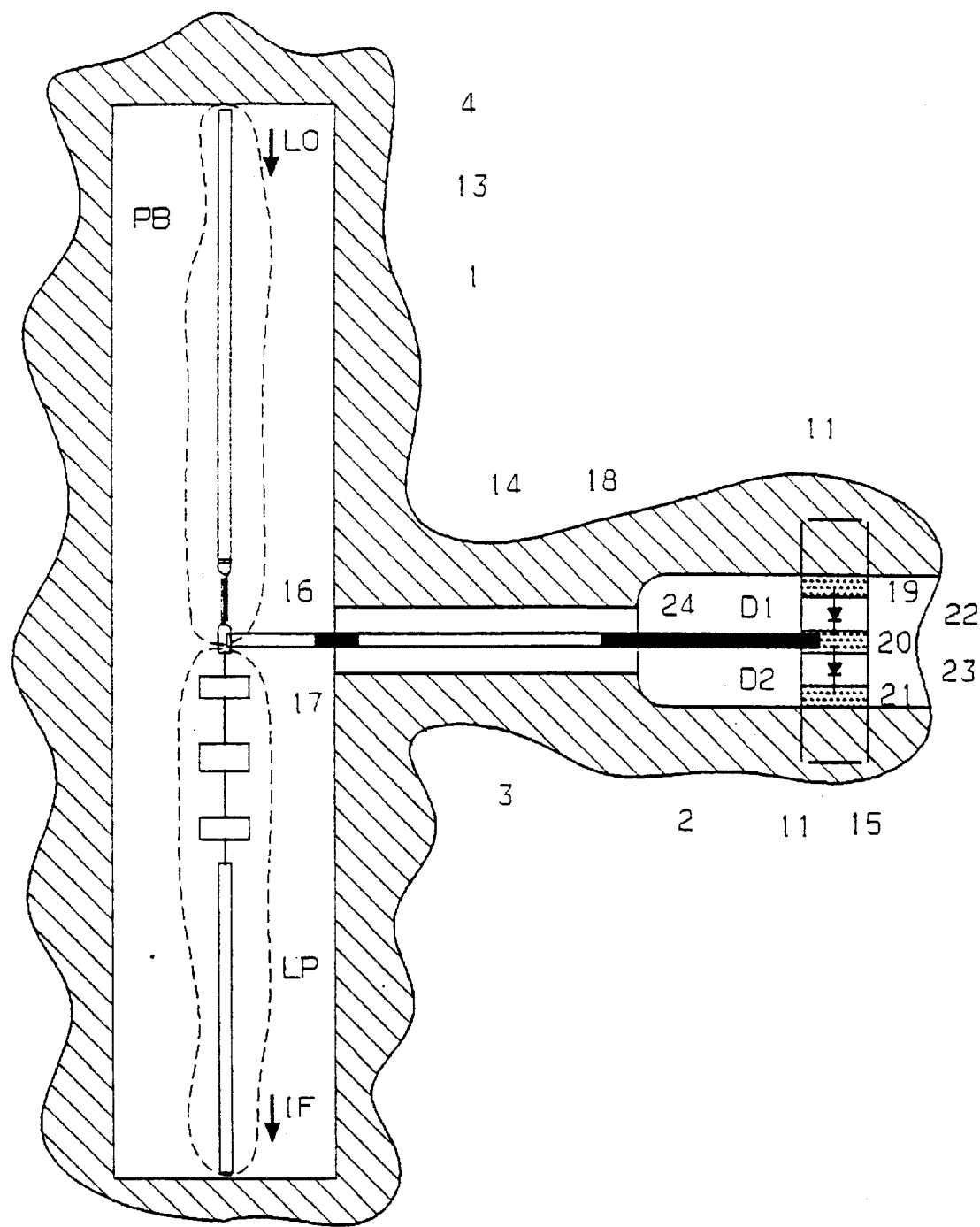
FIG. 3 shows in more detailed way the central part of FIG. 1 related to the thin film layout.

Referring to FIG. 3 in which the same elements of the FIGS. 1 and 2 are indicated by the same symbols it is possible to notice a first alumina layer 13 placed in cavity 4, a second alumina layer 14 placed in cavity 3, and finally a quartz plate 15 placed in cavity 2 where it penetrates in the grooves 11 delimited by the hatching of the figure. The layers 13 and 14 and plate 15, all of a rectangular shape, are welded to the metallic body 1. More in particular the sublayers 13 and 14 occupy completely the section of the respective cavity 4 and 3, while the rectangular plate 15 is put perpendicularly to the axis B—B (FIG. 1) and occupies a small central part of the rectangular section of cavity 2.

Layer 13 supports a diplexer filter set up by a pass-band section PB and by a low pass section LP. One end of the pass-band section PB is connected to the glass-bead 5, and therefore to the coaxial connector 7 of the local oscillator signal LO (visible in FIG. 1); the second end is connected to a short microstrip 16 put along the axis B—B of FIG. 1 starting from the centre of layer 13 and ending nearly in the proximity of the alumina layer 14. One end of the low pass section LP is connected to the glass-bead 6, and therefore to the coaxial connector 8 of the intermediate frequency signal IF (visible in FIG. 1); the second end is also connected to the short microstrip 16 in the same point where the second end of the pass-band section PB is connected. The filters PB and LO are realized in microstrip according to the known techniques, the filter PB comprises a block for the direct current set up by two short shown lines, one of which is connected to microstrip 16. The alumina layer 14 comprises a central microstrip 18 extending for nearly the whole length. A metallic strap 17 interconnects the microstrips 16 and 18. On the upper side of the quartz plate 15 the are the parallel metallic strips 19, 20 and 21 which extend for the whole shorter dimension of the plate parallel to the axis B—B of FIG. 1.

The central strip 20 is separated from the two side ones 19 and 21 by two spaces without layer 22 and 23. On the back part of plate 15 there is a metallization only below the side strips 19 and 21, and therefore the sector below the central strip 20 is free of metallization. Between the metallic strips 19 and 20 a first diode D1 is coupled which anode is connected to side strip 19 and which anode is connected to central strip 20. Between the metallic strips 20 and 21 a second diode D2 is coupled which anode is connected to the central strip 20 and which cathode is connected to the remaining side strip 21. The metallization of the side-strips 19 and 21 continues in the sectors (hatched in FIG. 3) of the respective grooves 11 where it is welded to the metallic body 1. A metallic bar 24 connects microstrip 18 of the alumina layer 14 to the central strip 20 of quartz plate 15 extending in the air inside cavity 2. Referring to FIG. 2 the grooves 11 extend for about half of the thickness of the metallic body, therefore the layers 13 and 14, plate 15 and both bar 17 and bar 24 lay on one and the same plane.

As said before on the upper side of the metallic body 1 a rectangular waveguide (not shown) is rigidly connected giving onto cavity 2. This latter one is in reality a part of the above-mentioned waveguide closed at the lower end by the metallic short circuit plate 12 (FIG. 2). The shorter dimension of the rectangular section of cavity 2 is smaller than that of the rectangular guide converging the signal RF (cavity in reduced guidance) in order to avoid losses of power and therefore of conversion caused by the impedance missmatching between guide and cavity.

Referring to the previous figures to illustrate the functioning of the converter the circuit structure of FIG. 3 is that of a simply balanced mixer operating in fundamental. The local oscillator signal LO injected in the connector 7 passes in this order: glass-bead 5, pass-band filter PB, microstrip 16, strap 17, microstrip 18, bar 24, and reaches the metallic strip 20 connected to the central outlet of the pair of diodes D1, D2. The low pass filter LP prevents the signal LO from reaching the gate of the immediate frequency signal set up by connector 8. The radio frequency signal RF present in guide is directly injected into cavity 2, which is equal to a part of the guide itself as far as regards the propagation of the electromagnetic field. The signal RF injected in cavity reaches the diodes D1 and D2 where the beating with the signal LO and the following generation of the intermediate frequency signal IF take place. If the structure is perfectly balanced, the signal IF comes out without any distortion from the central outlet of the diodes and passes in this order through: bar 24, microstrip 18, strap 17, microstrip 16, low pass filter LP, glass-bead 6 to get out from connector 8. The pass-band filter PB prevents the signal IF from reaching the gate of the local oscillator signal set up by connector 7. According to what pointed out before it appears evident the function of the diplexer filter made up of the PB and LP filtering sections, that is of isolating the LO and IF ports.

Regarding on the other hand the isolations for the RF/LO ports, and for the IF/RF ports, these are the tasks of the balun set up by cavity 2, plate 15, and bar 24, where the diodes D1 and D2 operate as load impedance of the balun on the side RF. The isolations mentioned before are assured by the degree of balance of the diodes which electric characteristics must be perfectly identical, what might be easily obtained by integrated diodes in a single chip. As known from the theory of the simply balanced mixers, the signal RF sees the diodes D1 and D2 in series while the signals LO and IF see the same diodes in antiparallel, by this a decoupling is realized between the ways interesting the signal RF and those regarding the signals LO and IF. In the realization according to the invention the signal RF is present with opposite polarity between the metallic strips 19 and 21 at the end of plate 15, while the central metallic strip 20 is a virtual ground point for RF. The same metallization 20 is a hot point for the signals LO and IF, while the remaining metallizations 19 and 21 are the ground for these signals. Therefore the signal appears balanced compared to ground, while the signals LO and IF turn out to be out of balance as required for their propagation in microstrip. Moreover the signal IF does not spread in cavity 2 and in the rectangular guide, because its frequency is below the cutoff frequency of the guide. The signal LO spreading in the hemicavity 2 beyond the line of the diodes will be reflected again to the latter ones with the appropriate phase and it contributes again to the frequency conversion obtaining in this way major efficiency in the conversion. The position of plate 15 exactly in the centre of cavity 2 is justified by the fact that signal RF is the maximum in this position, while it cancels out on the sides of the cavity itself so that there is no RF dispersion inside cavity 14.

The length of microstrip 18 does not influence the electric behaviour of the balun, because the decoupling of the signal RF has already happened at this side of the balun. Cavity 3 with layer 14 and microstrip 18 have only been introduced to make the dimensions of the metallic body and of the corresponding closing flange compatible with the rest of the equipment on which the converter is installed. If there are not the above-mentioned dimensional compatibility restraints it will be possible to reduce the dimensions of the converter making in the metallic body 1 only the cavities 2 and 4 communicating with each other and welding bar 24 directly to the short microstrip 16. Another aspect necessary to take into consideration is that of reducing the losses due to undue reflections of the signal RF because of the impedance missmatching as already said concerning the realization of cavity 2 in reduced height guidance. In order to avoid of inconveniences the distance between the metal plate 12 closing at the bottom cavity 2 setting up a short circuit for the signal RF and the reference plane of the diodes D1, D2 corresponding to the plane of the metallic strips 19, 20 and 21 must be such to report an open circuit for the signal RF on said plane. Moreover the characteristic impedance $Z_G$ of the rectangular waveguide must coincide with the characteristic impedance $Z_{CAV}$ of cavity 2 inclusive of the contribution due to the impedance of the diodes if this condition is not realized it is necessary to insert between the waveguide and cavity 2 a little rectangular guide trunk with a length equal to a quarter-wave at the centre band frequency of the signal RF and of the characteristic impedance:

$$Z_T = \sqrt{\sqrt{Z_G \cdot Z_{CAV}}}$$

In the converter of the just described and not limiting example the signal RF has a centre band frequency of 38 GHz, the signal LO has a frequency of 37 GHz and the signal being IF has a centre band frequency of 1 Ghz. The coaxial connectors 7 and 8 for the signals LO and IF are of the K type, the rectangular waveguide for the signal RF is of the type WR 28 (UG-599 U), the used diodes are of the type GaAs Hp HSCH-9201. The most general electric performances are summarized in the following table:

| | |
|---|---|
| Band RF | 37–40 Ghz |
| Band LO | 35,5–38,5 GHz |
| Band IF | DC - 1,5 GHz |
| LO power dynamic range | 10–15 dBm |
| Conversion loss RF/IF | 8 dB typical |

The down-converter of the example operates also as an upconverter to obtain a transmission signal RF without the necessity to modify somehow the described circuit structure, in this case the signal IF is an input signal and the signal RF an output signal.

A functioning at lower frequencies includes an increase of the dimensions of the rectangular waveguide in addition to that of the converter, therefore a frequency reduction turns out to be less convenient. Despite this, when the use of the same structure is wanted, plate 15 can be realized using a more suitable alumina layer. Finally it is necessary to notice that regarding the electric functioning of the converter it is the aim of the cavities 4 and 3 to sustain the diplexer filter and layer 14 with the microstrip 18 avoiding—once closed by the upper metal flange—the spreading of spurious radiations in the surrounding space. Completely different is the function of cavity 2 which—as already said—is equivalent to a part of the waveguide enabling the diodes put at the centre to act as frequency mixers.

While a particular embodiment of the present invention has been shown and described, it should be understood that the present invention is not limited thereto since other embodiments may be made by those skilled in the art without departing from the scope thereof.

It is thus contemplated that the present invention encompasses any and all such embodiments covered by the following claims.

What is claimed is:

1. Microwave frequency converter comprising:
   at least two adjacent rectangular cavities, respectively for a local oscillator signal and for a radio frequency signal, having an intercommunicating hole between said at least two adjacent rectangular cavities;
   a dielectric plate in the radiofrequency cavity on which a coplanar line is placed perpendicularly to the direction of arrival of the radiofrequency signal;
   at least two mixer diodes operatively connected to the coplanar line in the rectangular radiofrequency cavity, both diodes being illuminated by the radiofrequency signal;
   a coupler coupling, through said intercommunicating hole, the local frequency signal to a central metal strip of the coplanar line;
   a metal short-circuit plate closing the rectangular radiofrequency cavity at the bottom;
   two opposite walls of the rectangular radiofrequency cavity each provided with a central groove which extends up from the bottom to near the center of the rectangular radiofrequency cavity, and into which the dielectric plate, having a surface substantially orthogonal to the direction of arrival of the radiofrequency signal, is inserted and two outer metal strips of said coplanar line are welded to the cavity walls.

2. Microwave frequency converter according to claim 1, wherein the metallic strips forming the coplanar line on the dielectric plate are parallel to the major dimension of the rectangular cross-section of the radiofrequency cavity.

3. Microwave frequency converter according to claim 1, wherein the two diodes are connected in series, the ends of the series being respectively welded to the two external strips of the coplanar line and the central point of the series being connected to the remaining central strip.

4. Microwave frequency converter according to claim 1, wherein the coplanar line, the diodes, and said coupler, set up a balun preventing the propagation of a balanced radio frequency signal toward the local frequency signal cavity, and supplies a transition for the radio frequency signal from the radio frequency cavity to a unbalanced portion of the coupler.

5. Microwave frequency converter according to claim 1, wherein said coupler includes a microstrip diplexer filter lodged in the local frequency signal cavity, the diplexer filter having one input port for a local oscillator signal and an input or exit port for an intermediate frequency signal either externally supplied or generated by said diodes, the diplexer filter being set up by a pass-band section which lets the local oscillator signal get through towards the two frequency mixer diodes, and by a low-pass section which either lets pass the intermediate frequency signal externally supplied towards said diodes, or lets the intermediate frequency signal generated by the diodes get through towards the respective exit port.

6. Microwave frequency converter according to claim 5, wherein the at least two adjacent rectangular cavities are formed by a metal body housing and the intercommunicating hole between the at least two adjacent rectangular cavities is a third cavity in the metal body housing including a second dielectric plate which supports, for nearly its complete length, a microstrip connected on one side to said central metal strip of the coplanar line, through a metal bar, and on the opposite side to a point common to said two sections of the microstrip diplexer filter through a metal strap.

7. Microwave frequency converter according to claim 5, wherein said diplexer filter, said first dielectric plate and said second dielectric plate lie all on the same plane.

8. Microwave frequency converter according to claim 1, wherein the distance between said short-circuit metal plate and the plane of the coplanar line is such as to effectuate on said plane an open circuit for said radiofrequency signal.

9. Microwave frequency converter according to claim 1, wherein said dielectric plate is made of quartz and the two mixer diodes operate in the range of millimetric radiowaves.

10. Microwave frequency converter according to claim 1, comprising a closure metal flange which holds a waveguide with rectangular section facing said rectangular radiofrequency cavity for the radio frequency signal.

11. Microwave frequency converter according to claim 10, wherein the shortest dimension of the rectangular section of the rectangular radiofrequency cavity for the radio frequency signal is smaller than, the corresponding dimension of said rectangular faced waveguide.

12. Microwave frequency converter according to claim 11, wherein a little waveguide trunk with rectangular section is interposed between said faced waveguide and said rectangular radiofrequency cavity for the radio frequency signal, the little waveguide trunk having a length equal to a quarter-wave at the center-band frequency of said radiofrequency signal and a characteristic impedance $Z_T$ which satisfies the following expression:

$$Z_T = \sqrt{\sqrt{Z_G \cdot Z_{CAV}}}$$

where $Z_G$ is the characteristic impedance of said faced waveguide and $Z_{CAV}$ is the characteristic impedance of said rectangular radiofrequency cavity of the radiofrequency signal, inclusive of the contribution due to the impedance of said diodes.

* * * * *